United States Patent [19]

Lee

[11] Patent Number: 5,633,823
[45] Date of Patent: May 27, 1997

[54] METHOD OF NARROWING FLASH MEMORY DEVICE THRESHOLD VOLTAGE DISTRIBUTION

[75] Inventor: Roger R. Lee, Boise, Id.

[73] Assignee: Micron Technology, Inc., Boise, Id.

[21] Appl. No.: 348,649

[22] Filed: Dec. 1, 1994

[51] Int. Cl.$^6$ ............................................. G11C 7/00
[52] U.S. Cl. ........................... 365/185.29; 365/185.3; 365/185.33; 365/218
[58] Field of Search ........................ 365/218, 185, 365/900, 185.29, 185.3, 185.33

[56] References Cited

U.S. PATENT DOCUMENTS

| | | | |
|---|---|---|---|
| 4,279,024 | 7/1981 | Schrenk | 365/203 |
| 4,805,151 | 2/1989 | Terada et al. | 365/218 |
| 5,163,021 | 11/1992 | Mehrotra et al. | 365/185 |
| 5,233,562 | 8/1993 | Ong et al. | 365/218 |
| 5,237,535 | 8/1993 | Miekle et al. | 365/218 |
| 5,268,870 | 12/1993 | Harari | 365/218 |
| 5,272,669 | 12/1993 | Samachisa et al. | 365/185 |
| 5,335,198 | 8/1994 | Van Buskirk et al. | 365/185 |
| 5,424,993 | 6/1995 | Lee et al. | 365/218 |

*Primary Examiner*—Son T. Dinh

[57] ABSTRACT

A method of erasing a sector for a flash memory device, the sector having a plurality of word lines with each word line having a plurality of memory cells therealong, each cell having a source region, comprises various steps. First, all of the memory cells in the sector are programmed. The memory cells are then simultaneously erased by applying a first voltage to the sources and a second voltage to the word lines. Subsequently, a first cell along a first word line is read to determine if the first cell is under-erased. Responsive to the first cell being under-erased, the first voltage is applied to the source region of the first cell and the second voltage is applied to the first word line while a third voltage is applied to the plurality of word lines except the first word line, the third voltage being higher than the second voltage.

17 Claims, 2 Drawing Sheets

|  | Control Gate | Source | Drain |
|---|---|---|---|
| Program | 12 V | 0 V | 6 V |
| Erase | GND | 12 V | FLOAT |
| Read | 5 V | GND | 1 V - 2 V |

FIG. 1

METHOD OF NARROWING FLASH MEMORY DEVICE THRESHOLD VOLTAGE DISTRIBUTION

FIELD OF THE INVENTION

The invention relates to semiconductor memory devices, and more specifically to a method for erasing a sector of a flash memory device.

BACKGROUND OF THE INVENTION

In recent years flash memory has emerged as an important category of memory device, as they combine high density with electrical erasability. Flash memories comprise a plurality of one-transistor flash electrically erasable programmable read-only memory (EEPROM) cells formed on and within a semiconductor substrate. Each cell comprises a P-type conductivity substrate, an N-type conductivity source region formed within the substrate, and an N-type conductivity drain region also formed within the substrate. A floating gate is separated from the substrate by a dielectric layer. A second dielectric layer separates a control gate from the floating gate. A P-type channel region within the substrate is interposed between the source and drain. The control gate of the cell is formed from a word line, and a plurality of cells are along each word line such that one word line controls a plurality of cells. A digit line interconnects the drain regions of a plurality of cells.

Various voltages are associated with a flash cell, as shown in FIG. 1. To program a flash cell the drain region and the control gate are raised to predetermined potentials above the potential applied to the source region. For example 12 volts is applied to the control gate, 0.0 volts is applied to the source, and 6.0 volts is applied to the drain. These voltages produce "hot electrons" which are accelerated from the substrate across the dielectric layer to the floating gate. This hot electron injection results in an increase of the floating gate threshold by approximately two to four volts.

To erase a flash cell a high positive potential, for example 12 volts, is applied to the source region, the control gate is grounded, and the drain is allowed to float. These voltages are applied for a timed period, and the longer the period the more the cell becomes erased. A strong electric field develops between the floating gate and the source region, and negative charge is extracted from the floating gate to the source region, for example by Fowler-Nordheim tunneling. If an unprogrammed flash EEPROM cell in an array of such cells is repeatedly erased under these conditions, the floating gate will eventually acquire a more positive potential. Consequently, even with the control gate being grounded the cell will always be turned on. This causes column leakage current thereby preventing the proper reading of any other cell in the column of the array containing this cell as well as making programming of the other cells on the same column increasingly more difficult. This condition, referred to as "overerase," is disadvantageous since the data programming characteristics of the memory cell is deteriorated so as to cause endurance failures.

To determine if a cell is programmed, the magnitude of the read current is measured, for example by grounding the source, applying about 5.0 volts to the control gate, and applying between 1.0 and 2.0 volts to the drain. Under these conditions, an unprogrammed cell will conduct at a current level of about 50 to 100 microamps. The programmed cell will have considerably less current flowing.

To change the content of a flash memory device all cells are programmed and then erased and then selected cells are programmed. By first programming all of the cells and then erasing all cells, over-erasure of any unprogrammed cells is reduced. An over-erase condition must be avoided to prevent a cell from functioning as a depletion transistor in the read mode of operation. During a read mode of an over-erased memory cell an entire column of a sector can be disabled.

An advantage of a flash memory device is that an entire sector of cells can be erased simultaneously as the sources for each cell within the sector are tied together. Some cells, however, erase more quickly than others resulting from manufacturing variations from cell to cell such as the dielectric thickness between the substrate and the floating gate. The flash erase cycle must therefore be optimized for the "average" cell of the entire sector. Some cells will be slightly over-erased while some remain slightly under-erased, and thus a variation in the threshold voltage of the cells in the sector results. A method of erasing cells within a sector which provides for a more uniform threshold voltage distribution would be desirable.

SUMMARY OF THE INVENTION

A method of erasing memory cells in a sector of a memory device, the sector having a plurality of word lines and a plurality of memory cells along each of the word lines, comprises the steps of erasing the memory cells in the sector simultaneously, and then reading a first cell along a first word line to determine if the first cell is under-erased. Responsive to the first cell being under-erased, only the plurality of cells along the first word line are further erased.

Objects and advantages will become apparent to those skilled in the art from the following detailed description read in conjunction with the appended claims and the drawings attached hereto.

BRIEF DESCRIPTION OF THE DRAWINGS

FIG. 1 is a table showing the voltage associated with a flash memory device.

DETAILED DESCRIPTION OF THE INVENTION

Figure 2:
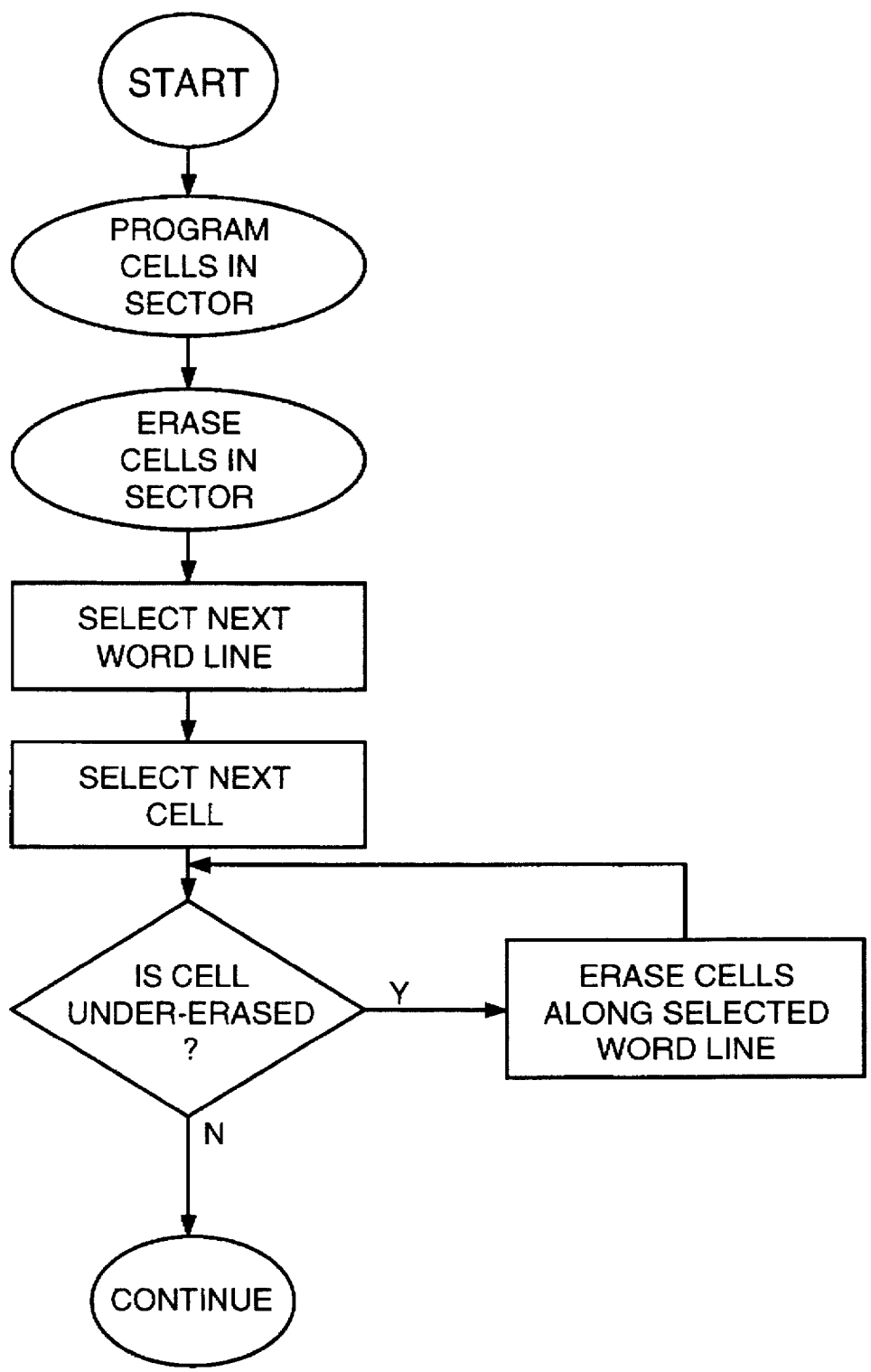
FIG. 2 is a flow chart describing one embodiment of the inventive method.

A memory device such as a flash memory device typically comprises a sector having a plurality of word lines and a plurality of memory cells along each word line. One embodiment of the inventive method for erasing memory cells in a sector of a memory device, as described in FIG. 2, comprises programming the memory cells in the sector, then erasing the memory cells in the sector simultaneously. Subsequently, a first cell along a first word line is read to determine if the first cell is under-erased. If the first cell is under-erased, only the plurality of cells along the first word line are further erased while the remaining cells in the sector along the other word lines are maintained.

The method of erasing can comprise various voltages on the word lines and the source lines, while the digit lines are allowed to float. A negative voltage can be applied to the first word line and, simultaneously, a voltage greater than or equal to 0.0 volts (a nonnegative voltage) is applied to the plurality of word lines except the first word line. For example, about −10 volts can be applied to the first word line while about +5 volts is applied to the source region of the first cell and to the plurality of word lines in the sector except for the first word line. These voltages can be applied for a timed interval, for example from about 0.1 millisecond to about 1.0 second, which may vary depending on the voltages applied to the word lines and the source regions. Additionally, the under-erased cell can be re-read to determine if it remains under-erased. If it remains under-erased, the erase pulse is again applied, then the cell is re-read.

By further erasing only those cells along the word line where an under-erased cell is detected, the cells along the remaining word lines are not over-erased while the under-erased cell is being further erased.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, various voltages can be applied to the word lines and the sources while maintaining the spirit of the invention. It is therefore contemplated that the appended claims will cover any such modifications or embodiments as fall within the true scope of the invention.

What is claimed is:

1. A method of erasing memory cells in a sector of a memory device, said sector having a plurality of word lines and a plurality of memory cells along each of said word lines, said method comprising:

erasing a group of said memory cells in said sector simultaneously;

subsequent to said step of erasing, reading a first cell of said group along a first word line to determine if said first cell is under-erased;

responsive to said first cell being under-erased, further erasing only those cells of said group which are along said first word line by applying a negative voltage to said first word line and, simultaneously a voltage greater than or equal to 0.0 volts to each word line of said plurality of word lines except said first word line.

2. The method of claim 1 wherein during said step of further erasing, about −10 V is applied to said first word line, about +5 V is applied to a source of said first cell, and about +5 V is applied to each word line of said plurality of word lines except said first word line.

3. The method of claim 2, wherein said voltages are applied for between about 0.1 millisecond to about 1.0 second.

4. The method of claim 1 further comprising the step of programming said memory cells in said sector prior to said step of erasing said memory cells.

5. The method of claim 1, further comprising the step of:

re-reading said first cell subsequent to said step of further erasing to determine if said first cell remains under-erased.

6. The method of claim 5, further comprising the step of:

responsive to said first cell remaining under-erased, further erasing only said plurality of cells along said first word line.

7. A method of erasing memory cells in a sector of a flash memory device, said sector having a plurality of word lines and a plurality of memory cells along each of said word lines, said method comprising:

flash erasing said memory cells in said sector;

subsequent to said step of flash erasing, reading a first cell along a first word line to determine if said first cell is under-erased;

responsive to said first cell being under-erased, further erasing said plurality of cells along said first word line while maintaining said cells along said plurality of word lines except said first word line by applying a negative voltage to said first word line and, simultaneously, applying a voltage greater than or equal to 0.0 volts to said plurality of word lines except said first word line.

8. The method of claim 7 wherein during said step of further erasing, about −10 V is applied to said first word line, about +5 V is applied to a source of said first cell, and about +5 V is applied to said plurality of word lines except said first word line.

9. The method of claim 8 wherein said voltages are applied for between about 0.1 millisecond to about 1.0 second.

10. The method of claim 7 further comprising the step of programming said memory cells in said sector prior to said step of flash erasing.

11. The method of claim 7, further comprising:

re-reading said first cell subsequent to said step of further erasing to determine if said first cell remains under-erased.

12. The method of claim 11, further comprising:

responsive to said first cell remaining under-erased, further erasing only said plurality of cells along said first word line.

13. A method of erasing a sector for a flash memory device, said sector having a plurality of word lines with each word line having a plurality of memory cells therealong, each cell having a source region, said method comprising:

programming all of said memory cells in said sector;

simultaneously erasing said plurality of memory cells by applying a first voltage to said source regions and a second voltage to said word lines;

subsequent to said step of simultaneously erasing, reading a first cell along a first word line to determine if said first cell is under-erased;

responsive to said first cell being under-erased, applying said first voltage to said source region of said first cell and said second voltage to said first word line while applying a third voltage to each word line of said plurality of word lines except said first word line, said third voltage being higher than said second voltage, wherein said first and third voltages are greater than or equal to 0.0 volts and said second voltage is negative.

14. The method of claim 13 wherein said first and third voltages are about +5 V and said second voltage is about −10 V.

15. The method of claim 13, further comprising:

subsequent to said step of applying said third voltage, re-reading said first cell to determine if said first cell remains under-erased.

16. The method of claim 15, further comprising:

responsive to said first cell remaining under-erased, further applying said first voltage to said source region of said first cell and said second voltage to said first word line while applying said third voltage to said plurality of word lines except said first word line.

17. The method of claim 13 wherein said first, second, and third voltages are applied for about 0.1 millisecond to about 1.0 second in response to said first cell being under-erased.

* * * * *

UNITED STATES PATENT AND TRADEMARK OFFICE
CERTIFICATE OF CORRECTION

PATENT NO.   : 5,633,823
DATED        : May 27, 1997
INVENTOR(S)  : Roger Lee

It is certified that error appears in the above-indentified patent and that said Letters Patent is hereby corrected as shown below:

Column 1, line 14, between "electrically erasable" please insert — - — (a dash).

Column 1, line 55, please delete "overerase" and insert —over-erased —.

Column 3, line 35, after "simultaneously" please insert —, — (a comma).

Signed and Sealed this

Sixteenth Day of September, 1997

Attest:

BRUCE LEHMAN

*Attesting Officer*              *Commissioner of Patents and Trademarks*